United States Patent
Kikkawa et al.

(10) Patent No.: US 7,777,251 B2
(45) Date of Patent: Aug. 17, 2010

(54) COMPOUND SEMICONDUCTOR DEVICE AND DOHERTY AMPLIFIER USING COMPOUND SEMICONDUCTOR DEVICE

(75) Inventors: Toshihide Kikkawa, Kawasaki (JP); Kenji Imanishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/591,574

(22) Filed: Nov. 24, 2009

(65) Prior Publication Data

US 2010/0066451 A1    Mar. 18, 2010

Related U.S. Application Data

(62) Division of application No. 12/071,219, filed on Feb. 19, 2008, now Pat. No. 7,663,162.

(30) Foreign Application Priority Data

Feb. 27, 2007  (JP) .............................. 2007-048053

(51) Int. Cl.
*H01L 29/80* (2006.01)
(52) U.S. Cl. ...................................... 257/192; 257/194
(58) Field of Classification Search ................. 257/192, 257/194
See application file for complete search history.

(56) References Cited

U.S. PATENT DOCUMENTS 5,446,296 A    8/1995    Nakajima ................... 257/194

FOREIGN PATENT DOCUMENTS

| EP | 0 562 551 A2 | 3/1993 |
|---|---|---|
| JP | 05-267352 | 10/1993 |
| JP | 2001-308315 | 11/2001 |
| JP | 2003-229439 | 8/2003 |
| JP | 2006-165207 | 6/2006 |
| JP | 2006-166141 | 6/2006 |
| WO | WO 00/65663 | 11/2000 |

OTHER PUBLICATIONS

Japanese Office Action—Notice of Reasons of Rejection dated Jan. 12, 2010 with Partial English translation.
Chen K. J. et al: "AlGaN-GaN Double-Channel HEMTs"; pp. 438-446.
Kevin J. Webb, et al.: "Fabrication and Operation of a Velocity Modulation Transistor"; pp. 2701-2709.
European Search Report dated Mar. 16, 2009.
Japanese Office Action dated Apr. 28, 2009.
Office Action dated Oct. 19, 2009 corresponding to Korean patent application No. 10-2008-17016.

*Primary Examiner*—Douglas M Menz
(74) *Attorney, Agent, or Firm*—Kratz, Quintos & Hanson, LLP

(57) ABSTRACT

A lower electron supply layer is disposed over a lower electron transport layer made of compound semiconductor. The lower electron supply layer is made of n-type compound semiconductor having an electron affinity smaller than that of the lower electron transport layer. An upper electron transport layer is disposed over the lower electron supply layer. The upper electron transport layer is made of compound semiconductor having a doping concentration lower than that of the lower electron supply layer or non-doped compound semiconductor. An upper electron supply layer is disposed over the upper electron transport layer. The upper electron supply layer is made of n-type compound semiconductor having an electron affinity smaller than that of the upper electron transport layer. A source and drain electrodes are disposed over the upper electron supply layer. A gate electrode is disposed over the upper electron supply layer between the source and drain electrodes.

3 Claims, 10 Drawing Sheets

US 7,777,251 B2

COMPOUND SEMICONDUCTOR DEVICE AND DOHERTY AMPLIFIER USING COMPOUND SEMICONDUCTOR DEVICE

CROSS-REFERENCE TO RELATED APPLICATIONS

This application is based on and claims priority of Japanese Patent Application No. 2007-048053 filed on Feb. 27, 2007; and is a Divisional of prior application Ser. No. 12/071,219 filed on Feb. 19, 2008, the entire contents of which are incorporated herein by reference.

BACKGROUND OF THE INVENTION

A) Field of the Invention

The present invention relates to a compound semiconductor device and a Doherty amplifier using the compound semiconductor device, and more particularly to a Doherty amplifier using field effect transistors, and a compound semiconductor device applicable to a peak amplifier of the Doherty amplifier.

B) Description of the Related Art

Developments are made vigorously in an electronic device which has crystalline AlGaN/GaN grown on a substrate made of sapphire, silicon carbide (SiC), gallium nitride (GaN) or silicon (Si), and uses a GaN layer as an electron transport layer (e.g., JP-A-2006-165207). GaN has a band gap of 3.4 eV and is expected to operate at higher breakdown voltage than GaAs having a band gap of 1.4 eV. If a high electron mobility transistor (HEMT) made of GaN and having a high breakdown voltage is used as an amplifier, this amplifier can operate along a load line corresponding to large load impedance on a graph showing current-voltage characteristic. A high efficiency operation is therefore possible.

A base station amplifier for world interoperability for microwave access (WiMAX) requires a nonconventional high efficiency. In order to realize a high efficiency, use of Doherty amplifiers has been studied (For example, JP-A-2006-166141).

FIG. 1 is a fundamental equivalent circuit diagram of a Doherty amplifier. A high frequency signal input from an input terminal Ti is divided into two parts. One part is input to a carrier (main) amplifier 100 and the other part is input to a peak (auxiliary) amplifier 101 via a quarter-wave line 103. Another quarter-wave line 102 is connected to an output terminal of the carrier amplifier 100. An output signal of the carrier amplifier 100 passes through the quarter-wave line 102 and thereafter is combined with an output signal of the peak amplifier 101. A load impedance $R_L$ is connected to an output terminal To. The carrier amplifier 100 is biased to operate as class A or class AB, and the peak amplifier 101 is biased so that an idle current is smaller than that of the carrier amplifier 100.

FIG. 9 shows an example of input/output characteristics of a Doherty amplifier. In FIG. 9, a solid line ac and a broken line ap0 indicate the input/output characteristics of the carrier amplifier 100 and peak amplifier 101, respectively. A solid line at indicates the input-output characteristics of the Doherty amplifier including the carrier amplifier 100 and peak amplifier 101.

When an input power is small and the Doherty amplifier operates in the back-off region, mainly the carrier amplifier 100 operates and outputs an output signal. When the input power is sufficiently large and an output power of the carrier amplifier 100 saturates, the peak amplifier 101 operates and outputs an output signal. During the operation in the back-off region, a d.c. consumption power of the peak amplifier 101 is sufficiently small. An efficiency of the Doherty amplifier itself is therefore high. Since output signals of the carrier amplifier 100 and peak amplifier 101 are combined, a large output power can be obtained.

It has been found that if a HEMT using GaN are applied to the carrier amplifier 100 and peak amplifier 101 of the Doherty amplifier, an efficiency of the Doherty amplifier is not improved so much as expected. This is because even if an idle current of the peak amplifier 101 is made small, a gain profile of the peak amplifier 101 is similar to that of the carrier amplifier 100. With similar gain profiles of both of the amplifiers, even if the Doherty amplifier operates in the back-off region, a gain of the peak amplifier 101 is large and a d.c. component of an output signal of the peak amplifier 101 is large. The efficiency is therefore not improved so much as expected.

While the carrier amplifier 100 operates in a saturated state, a Schottky barrier between a gate electrode and a substrate lowers, and a forward gate leak current increases. If the Doherty amplifier has distortion compensation, this distortion compensation is disabled by the gate leak current.

SUMMARY OF THE INVENTION

According to one aspect of the an embodiment, there is provided a compound semiconductor device including:

a lower electron transport layer made of compound semiconductor material;

a lower electron supply layer disposed over the lower electron transport layer and made of compound semiconductor material doped to n-type and having an electron affinity smaller than an electron affinity of the lower electron transport layer;

an upper electron transport layer disposed over the lower electron supply layer and made of compound semiconductor material having a doping concentration lower than a doping concentration of the lower electron supply layer or non-doped compound semiconductor material;

an upper electron supply layer disposed over the upper electron transport layer and made of n-type compound semiconductor material having an electron affinity smaller than an electron affinity of the upper electron transport layer;

a source electrode and a drain electrode disposed over the upper electron supply layer at a distance from each other and being in ohmic contact with the lower electron transport layer and the upper electron transport layer; and a gate electrode disposed over the upper electron supply layer between the source electrode and the drain electrode.

According to another aspect of an embodiment, there is provided a Doherty amplifier using the above-described compound semiconductor device as the peak amplifier.

DESCRIPTION OF THE PREFERRED EMBODIMENTS

Figure 1:
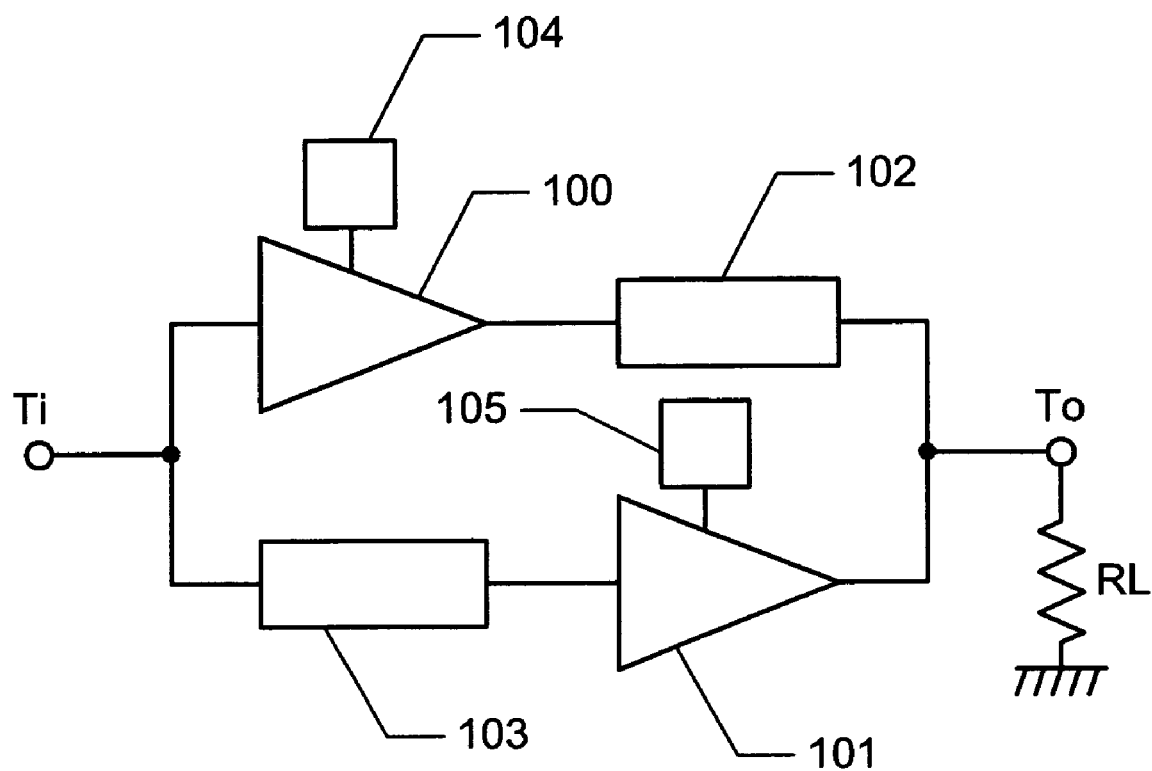
FIG. 1 is an equivalent circuit diagram of a Doherty amplifier according to a first embodiment.

FIG. 1 is an equivalent circuit diagram of a Doherty amplifier according to the first embodiment. Since the fundamental structure has already been described, redundant duplicates are avoided here. Each of the carrier amplifier 100 and peak amplifier 101 includes a HEMT using GaN as the material of an electron transport layer. Bias circuits 104 and 105 apply a d.c. gate bias voltage to respective gates of HEMT's constituting the carrier amplifier 100 and peak amplifier 101.

Figure 2:
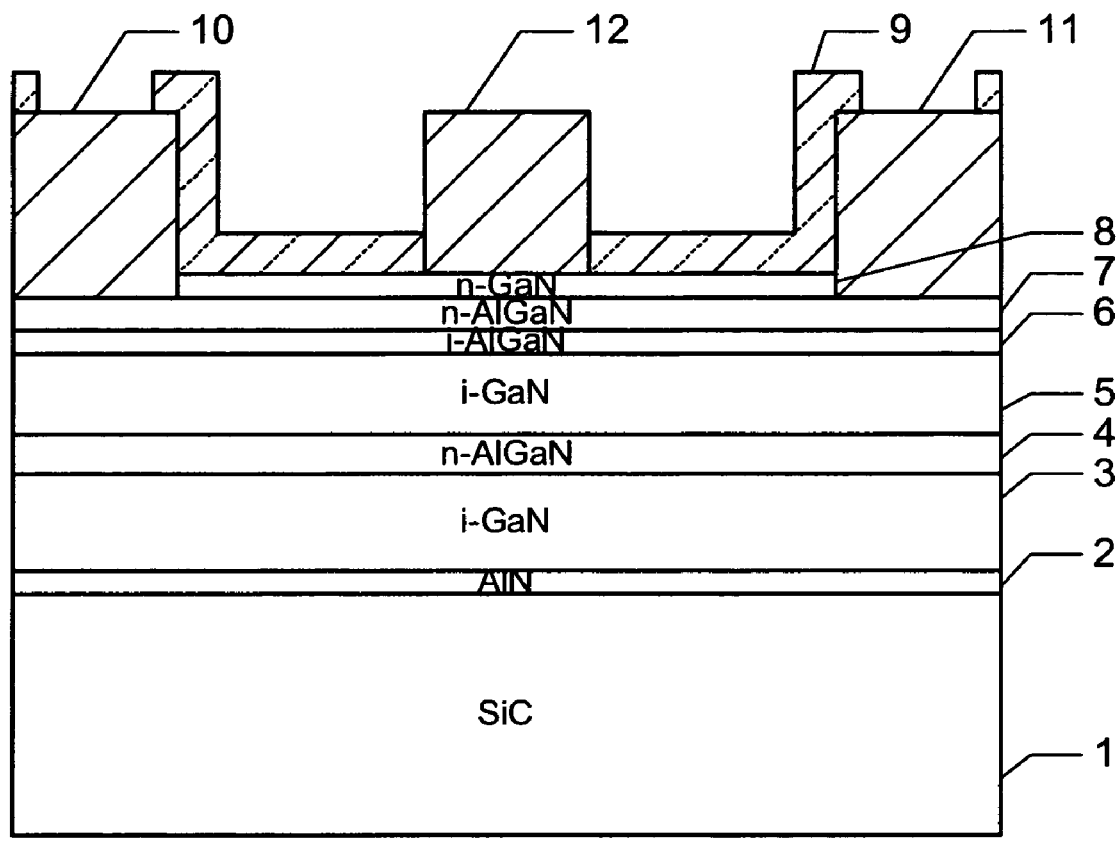
FIG. 2 is a cross sectional view of a HEMT of the first embodiment.

FIG. 2 is a cross sectional view of the HEMT to be applied to the peak amplifier 101. An underlie layer 2 made of AlN and having a thickness of 0.3 µm is formed on a substrate 1 made of single crystal SiC. On the underlie layer 2, a lower electron transport layer 3, a lower electron supply layer 4, an upper electron transport layer 5, a non-doped layer 6 and an upper electron supply layer 7 are stacked in this order.

The lower electron transport layer 3 is made of non-doped GaN and has a thickness of 3 µm. The lower electron supply layer 4 is made of compound semiconductor material having smaller electron affinity than that of the lower electron transport layer 3, for example, n-type AlGaN doped with Si only at $2\times10^{18}$ cm$^{-3}$. The lower electron supply layer 3 has a thickness of 20 nm. An atomic ratio Al/(group III element) in a region that is in contact with the lower electron transport layer 3 is 0.05. The atomic ratio Al/(group III element) lowers toward a shallow region, and a region that is in contact with the upper electron transport layer 5 has an atomic ratio Al/(group III element) of 0.02.

The upper electron transport layer 5 is made of non-doped GaN and has a thickness of 50 nm. The non-doped layer 6 is made of non-doped $Al_{0.25}Ga_{0.75}N$ and has a thickness of 5 nm. The upper electron supply layer 7 is made of compound semiconductor material having a smaller electron affinity than that of the upper electron transport layer 5, for example, n-type $Al_{0.25}Ga_{0.75}N$ doped with Si at $4\times10^{18}$ cm$^{-3}$. The upper electron supply layer has a thickness of 20 nm.

A source electrode 10 and a drain electrode 11 are disposed at a distance from each other on partial surfaces of the upper electron supply layer 7. Each of the source electrode 10 and the drain electrode 11 has a lamination structure having a Ta layer being in contact with the upper electron supply layer 7 and an Al layer formed on the Ta layer, and are in ohmic contact with the lower and upper electron transport layers 3 and 5. A TaAl$_3$ layer is formed between the Ta layer and Al layer by mutual diffusion.

The surface of the upper electron supply layer 7 between the source electrode 10 and drain electrode 11 is covered with a protective layer 8. The protective layer 8 is made of n-type GaN doped with Si at $5\times10^{18}$ cm$^3$, and has a thickness of 7 nm.

A gate electrode 12 is formed on a partial surface of the protecting layer 8 at a distance from both the source electrode 10 and drain electrode 11. The gate electrode 12 has a two-layer structure of a Ni layer being in contact with the protective layer 8 and an Au layer formed on the Ni layer. A gate length (a lateral size of the gate electrode 12 in FIG. 2) is set to 0.5 µm, and a unit gate width is set to 300 µm. The "unit gate width" means a width of a region in which the gate electrode can control a density of two-dimensional electron gas. An insulating layer 9 covers the surfaces of the protective layer 8 between the gate electrode 12 and source electrode 10 and between the gate electrode 12 and drain electrode 11. The insulating layer 9 is made of SiN.

Next, with reference to FIGS. 3A to 3D, description will be made on a manufacture method for the HEMT of the first embodiment.

Figure 3A:
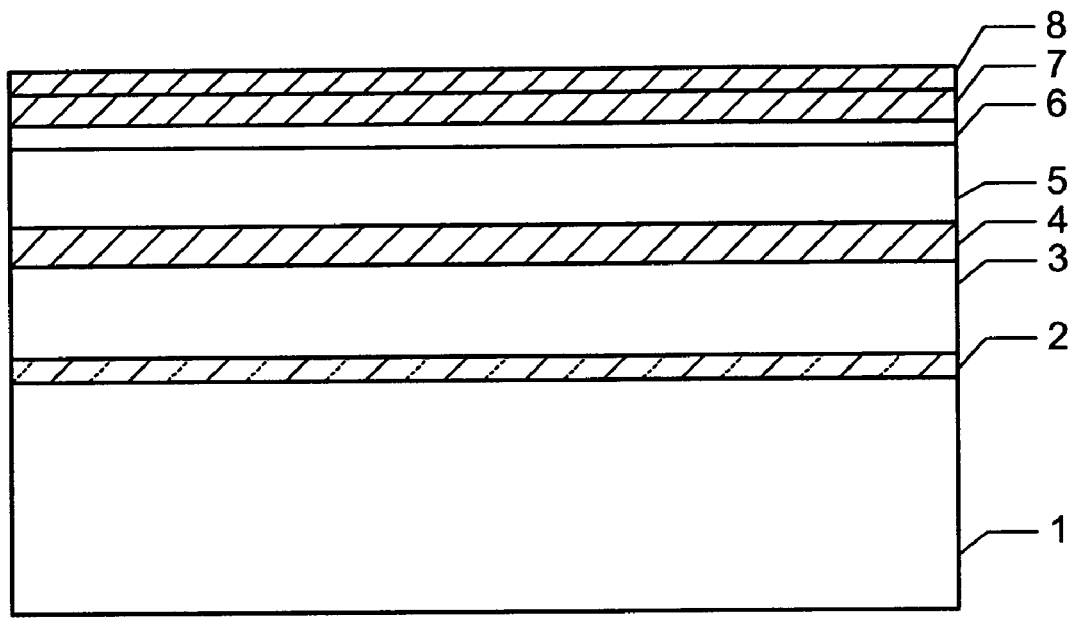
FIGS. 3A to 3D are cross sectional views of the HEMT during manufacture of the first embodiment.

As shown in FIG. 3A, each layer between the underlie layer 2 and the protective layer 8 is grown on the substrate 1 made of single crystal SiC, by metal organic vapor phase epitaxy (MOVPE). For example, trimethylaluminum is used as Al source material, trimethylgallium is used as Ga source material, ammonia is used as N source material, and silane is used as Si dopant source material.

Figure 3B:
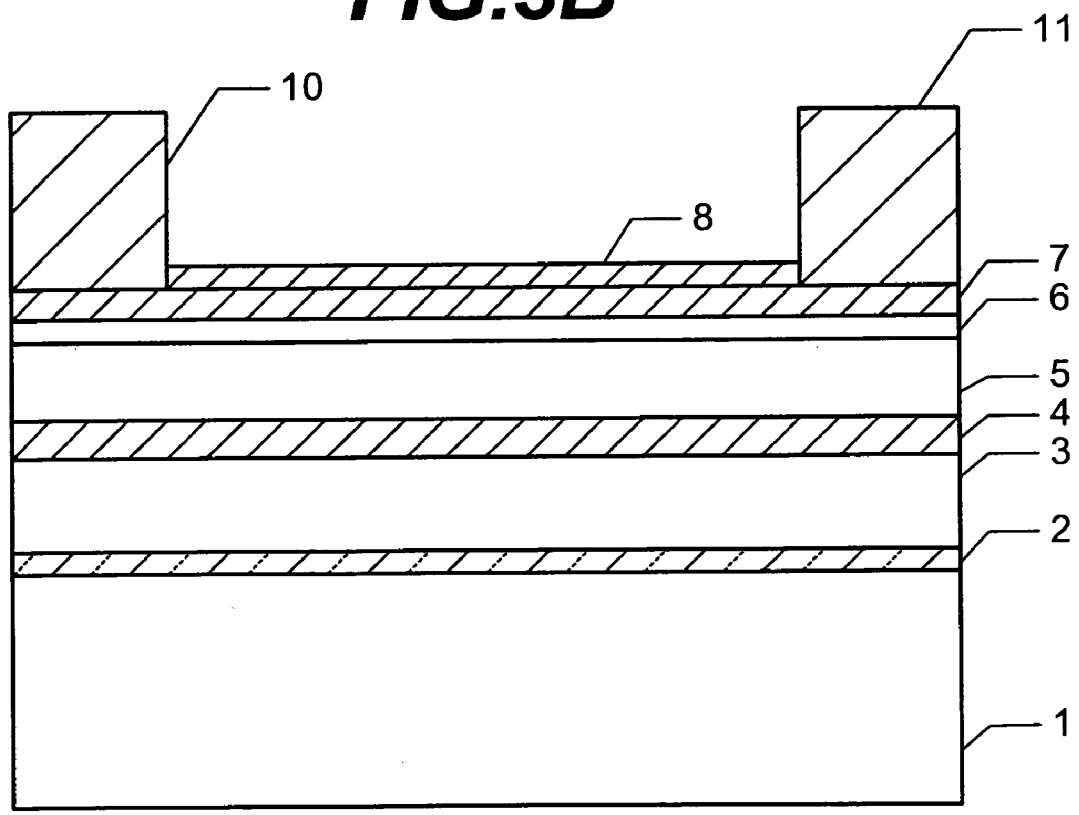

Description will be made hereunder on processes up to the structure shown in FIG. 3B. A resist film is formed on the protective layer 8. The resist film is exposed and developed to form openings corresponding to the source electrode 10 and drain electrode 11. A Ta film having a thickness of 10 nm and an Al film having a thickness of 280 nm are deposited on the whole surface of the substrate by vapor deposition. The resist film is removed together with the Ta film and Al film in the region other than the region of the source electrode 10 and drain electrode 11.

Next, heat treatment is performed for one minute at 550° C. in a nitrogen atmosphere, using a rapid thermal anneal (RTA) apparatus. With this heat treatment, the TaAl$_3$ film is formed between the Ta film and Al film.

Figure 3C:
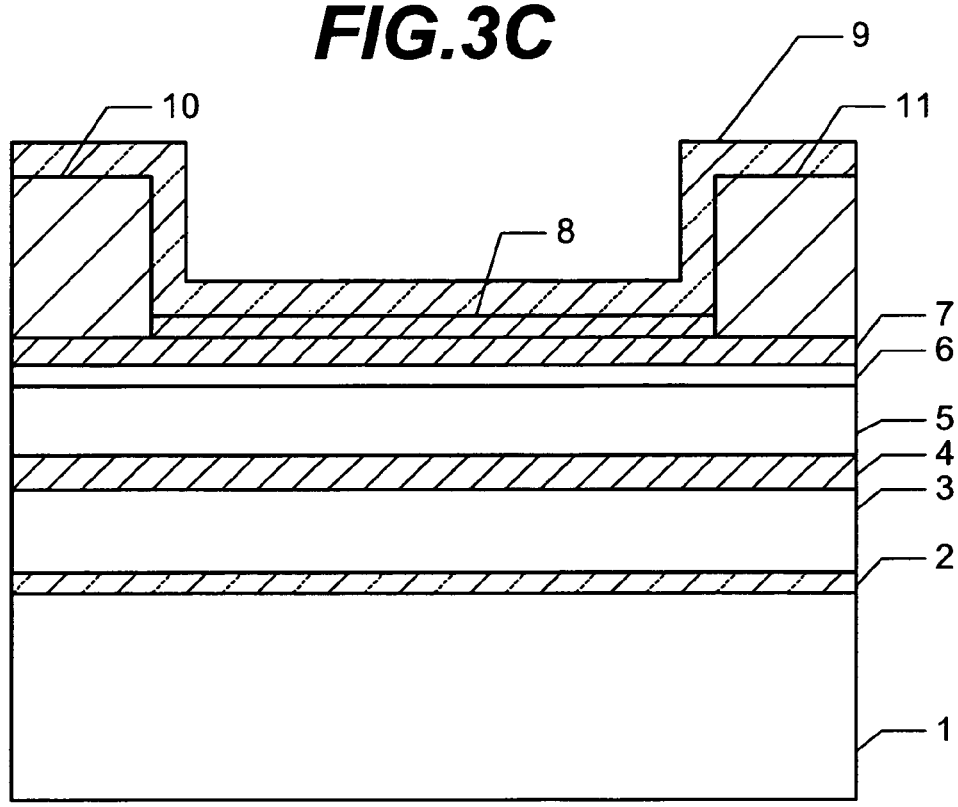

As shown in FIG. 3C, the insulating film 9 of SiN is formed on the whole substrate surface by plasma enhanced chemical vapor deposition (PE-CVD).

Figure 3D:
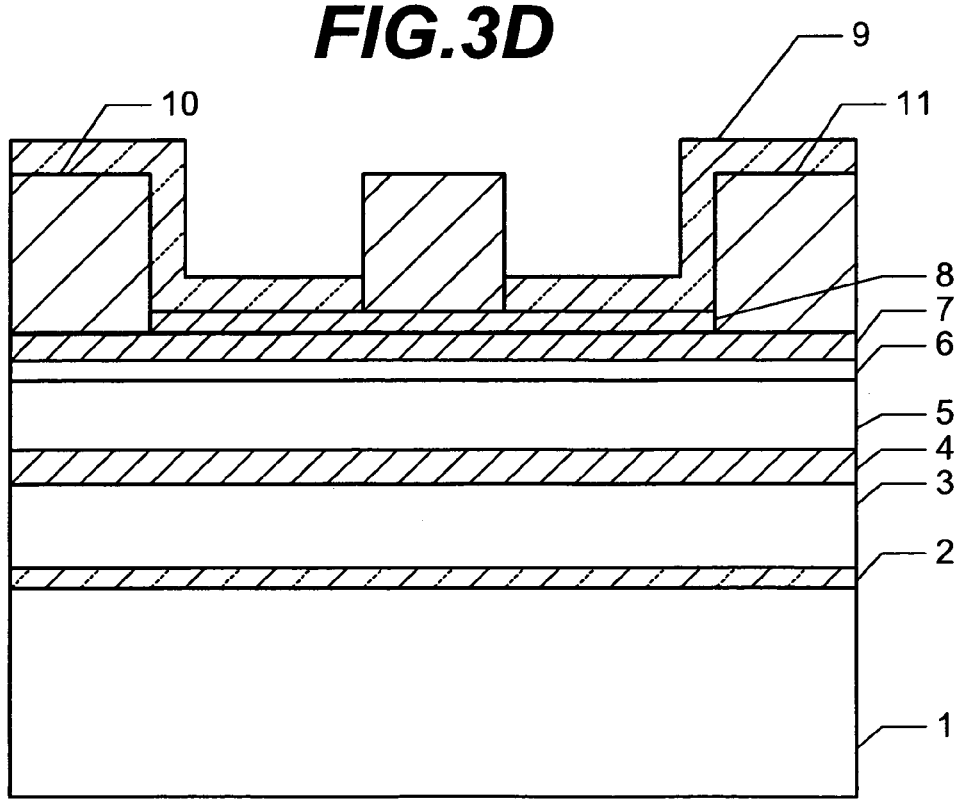

Description will be made hereunder on processes up to the structure shown in FIG. 3D. A resist film is formed on the insulating film 9. The resist film is exposed and deposited to form an opening corresponding to the gate electrode 12. A Ni film having a thickness of 10 nm and an Au film having a thickness of 200 nm are sequentially deposited on the whole substrate surface. Next, the resist film together with the Ni film and Au film deposited thereon is removed. In this manner, the gate electrode 12 is formed having a two-layer structure of the Ni film and Au film.

Thereafter, as shown in FIG. 2, upper surfaces of the source electrode 10 and drain electrode 11 are exposed by forming openings through the insulating film 9. Lastly, device isolation is performed through recess etching.

Figure 4:
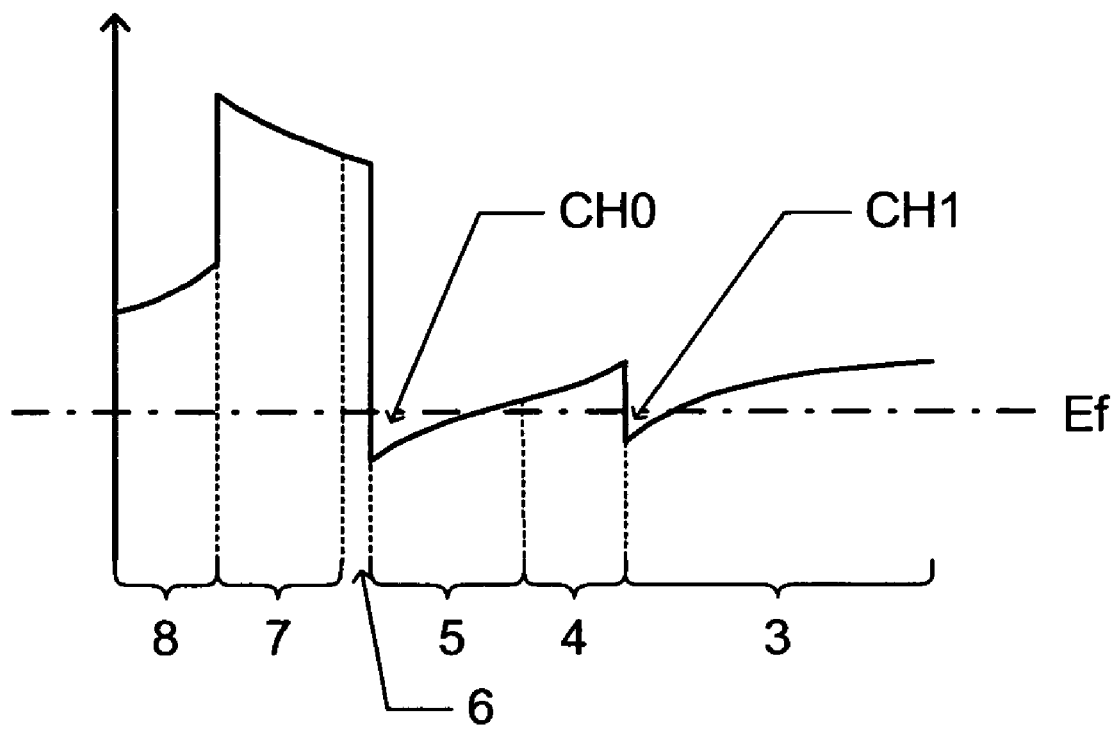
FIG. 4 is an energy band diagram of the HEMT of the first embodiment.

FIG. 4 shows an energy band diagram of the HEMT shown in FIG. 2. The abscissa represents a depth direction of each layer of the HEMT, and the ordinate represents a potential for electrons. A curve in FIG. 4 shows a potential at the lower end of a conduction band. A one-dot chain line Ef indicates a Fermi level. Piezo charges due to lattice mismatch are accumulated at an interface between the upper electron supply layer 7 and protective layer 8, at an interface between the upper electron transport layer 5 and non-doped layer 6 and at an interface between the lower electron transport layer 3 and lower electron supply layer 4. Therefore, slopes at the conduction band lower end are not the same on both sides of each of these interfaces.

Since electrons are accumulated at the interface between the upper electron transport layer 5 and non-doped layer 6, an upper channel CH0 consisting of two-dimensional electron gas is generated. In addition, since electrons are accumulated at the interface between the lower electron transport layer 3 and lower electron supply layer 4, a lower channel CH1 consisting of two-dimensional electron gas is generated.

In the HEMT of the first embodiment, in a state that the gate voltage is 0, a two-dimensional electron gas density of the lower channel CH1 is at most 5% of that of the upper channel CH0. A two-dimensional electron gas mobility of the lower channel CH1 is larger than 1000 cm/Vs.

Figure 5:
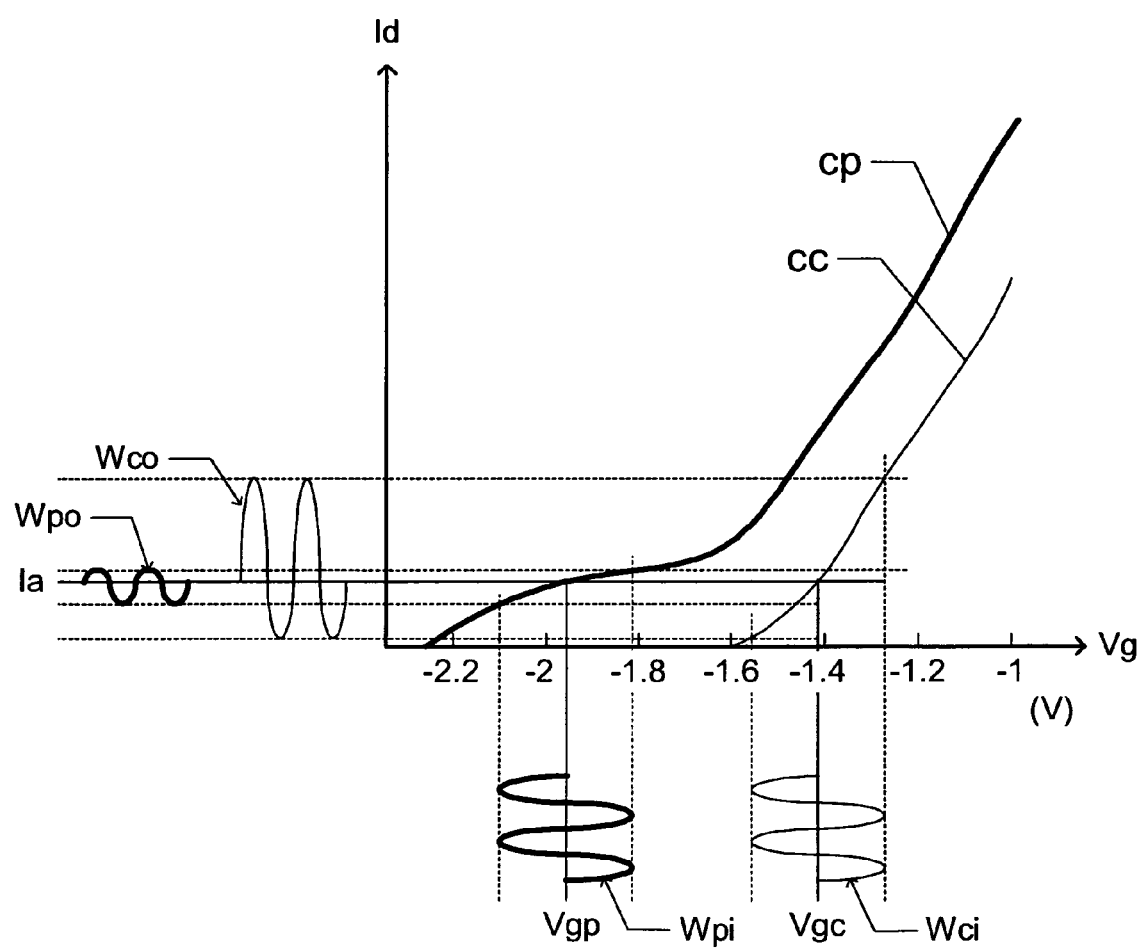
FIG. 5 is a graph showing the gate voltage-drain current characteristics of the HEMT of the first embodiment and a conventional HEMT.

FIG. 5 shows an example of gate voltage (Vg)-drain current (Id) characteristics of the HEMT of the first embodiment shown in FIG. 2. The abscissa represents a gate voltage Vg in the unit of "V", and the ordinate represents a drain current Id in an arbitrary unit. A bold line cp in FIG. 5 shows the characteristics of the HEMT shown in FIG. 2. For the purposes of reference, a narrow line cc is shown which indicates the characteristics of a general HEMT (hereinafter called "comparative example HEMT") in which the lower electron supply layer 4 and upper electron transport layer 5 are not disposed and the lower electron transport layer 3 is in contact with the non-doped layer 6. In this general HEMT, a channel consisting of two-dimensional electron gas is generated at an interface between the lower electron transport layer 3 and non-doped layer 6. A gate length was set to 0.8 μm and a unit gate width was set to 400 μm.

Consider now that the gate voltage Vg is changed gradually from a large negative voltage close to 0. In the HEMT of the first embodiment, as indicated by the curve cp, as the gate voltage Vg exceeds about −2.25 V, the lower channel CH1 shown in FIG. 3 is generated and the drain current Id starts flowing. As the gate voltage Vg further increases, the drain current Id saturates once. In the range of the gate voltage Vg of about −1.6 V or higher, the upper channel CH0 is generated so that as the gate voltage Vg increases, the drain current Id also increases. Although the gate voltage Vg is shown in the range of up to −1 V in FIG. 5, if the gate voltage Vg further increases, the drain current saturates eventually.

A slope of the graph in the range of the gate voltage Vg between −1.6 V and −1 V is steeper than that in the range of the gate voltage Vg not higher than −1.6 V. The reason, why a saturation current while only the lower channel CH1 is generated is smaller than that while also the upper channel CH0 is generated, is that the two-dimensional electron gas density of the lower channel CH1 is sufficiently lower than that of the upper channel CH0.

In contrast, in the comparative example HEMT in which the lower channel CH1 is not generated, a drain current Id hardly flows until the gate voltage Vg reaches about −1.6 V as indicated by the curve cc. In the range of the gate voltage Vg not lower than about −1.6 V, as the gate voltage Vg increases, the drain current Id also increases, as in the case of the HEMT of the first embodiment.

Therefore, in the HEMT of the first embodiment, the graph of the gate voltage-drain current characteristics has a shape with an extended gentle skirt.

A gate bias voltage Vgp is set so that a drain current Ia at no a.c. input voltage (idle current) is smaller than the saturation current induced by the lower channel CH1. When the amplitude of an input signal Wpi is small, a drain current Id flows, substantially only through the lower channel CH1, and an output signal Wp0 is obtained.

In the comparative example HEMT, a gate bias voltage Vgc corresponding to the idle current Ia is higher than the gate bias voltage Vgp. When a signal Wci having the same amplitude as that of the input signal Wpi is input, an output signal Wco is obtained. Since the slope of the curve cc near at the gate bias voltage Vgc is steeper than that of the curve cp near at the gate bias voltage Vgp, an amplitude of the output signal Wco is larger than that of the output signal Wpo, and the d.c. component of the drain current Id becomes large. Therefore, the d.c. component of the output power is large, and the efficiency is low.

In the HEMT of the first embodiment, since the amplitude of an output signal is small at a small input signal amplitude, it is possible to lower a gain and suppress an increase in the d.c. component of an output power.

As seen from FIG. 5, it is preferable to set the gate bias voltage in such a manner that the HEMT applied to the peak amplifier operates in the skirt region of the gate voltage-drain current characteristics while an input signal amplitude is small. More specifically, it is preferable to set the gate bias voltage to such a value that the lower channel CH1 of two-dimensional electron gas is generated in the lower electron transport layer 3, but the upper channel CH0 is not generated in the upper electron transport layer 5.

It is preferable to broaden the skirt region of the gate voltage-drain current characteristics, in order to achieve a sufficient fall of the gain while an input signal is small. For example, it is preferable that a difference between a gate voltage at which the drain current is 5% of the saturation value and a gate voltage at which the drain current is 1% of the saturation value is at least 0.5 V.

Figure 6A:
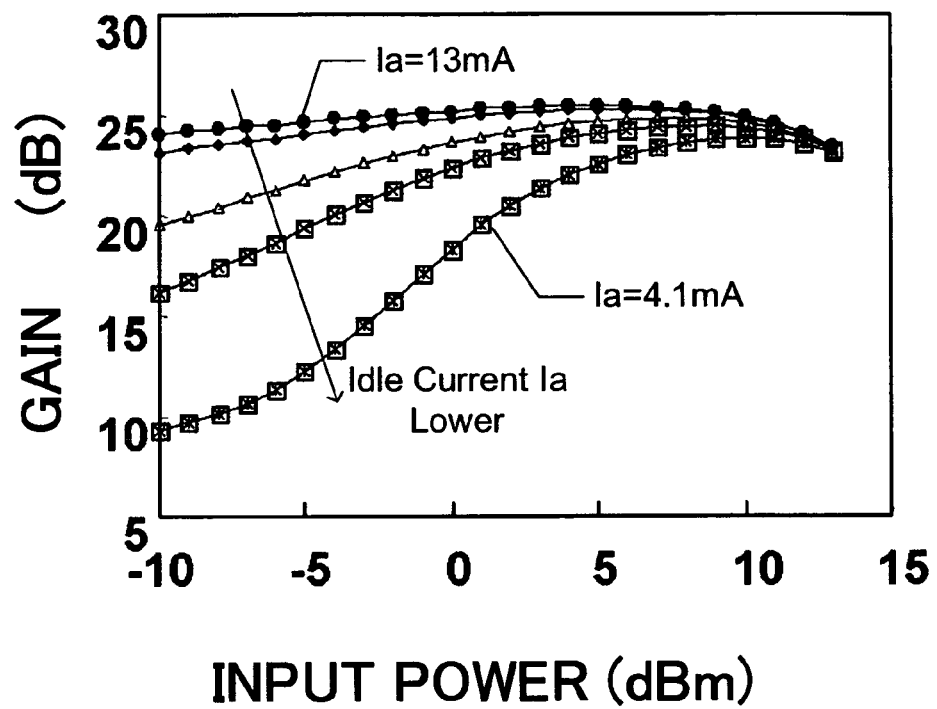
FIGS. 6A and 6B are graphs showing dependency of a gain upon an input voltage at various idle currents, of the HEMT of the first embodiment and a conventional HEMT, respectively.
Figure 6B:
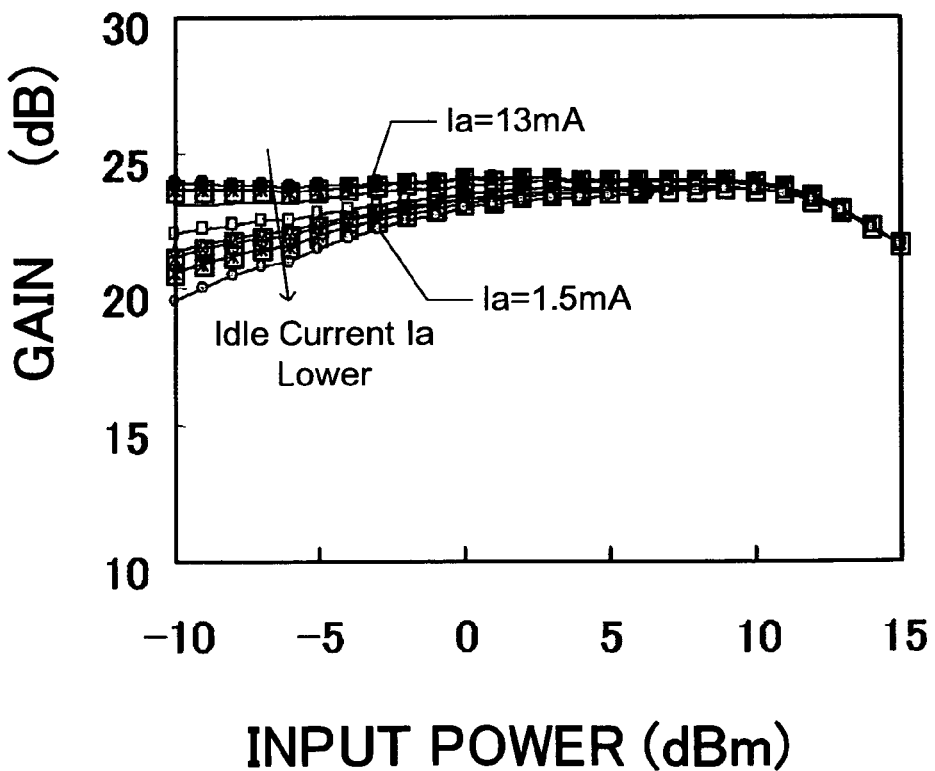

FIG. 6A shows the relation between a gain and an input power of the HEMT of the first embodiment in respect of five values of idle current. For the purposes of comparison, FIG. 6B shows the relation between a gain and an input power of the comparative example HEMT in respect of eight values of idle current. The abscissa represents an input power in the unit of "dBm", and the ordinate represents a gain in the unit of "dB". In the first embodiment shown in FIG. 6A, the idle current was changed from 13 mA to 4.1 mA in five stages, and in the comparative example shown in FIG. 6B, the idle current was changed from 13 mA to 1.5 mA in eight stages.

In the HEMT of the first embodiment, it can be seen that as the idle current is made small, the gain lowers considerably as the input power lowers. This is because when the idle current is made small, the HEMT operates in the region where the slope of the gate voltage-drain current characteristics cp shown in FIG. 5 is gentle. For example, when a gate voltage is set to obtain an idle current of 4.1 mA, the gain reaches maximum (about 24 dB) at an input power of about 10 dBm, and the gain declines to 9 dB at an input power of −10 dBm. A gain difference is about 15 dB.

In contract, in the comparative example, even if the idle current is made small, a large reduction in the gain does not appear because the slope of the gate voltage-drain current characteristics cc remains steep. As the gate bias voltage is set to obtain an idle current of 1.5 mA, a difference is at most 5 dB between a gain (about 19 dB) at an input power of −10 dBm and the maximum gain (about 24 dB). Namely, in the HEMT of the first embodiment, by properly setting the idle current, a difference can be made large between a gain at a small input power and that at a large input power. For example, when the gate bias voltage is set to a voltage (in FIG. 5, Vg=−2.25 V) at which the drain current starts flowing, a difference between the maximum and minimum gains can be set to at least 10 dB.

Figure 9:
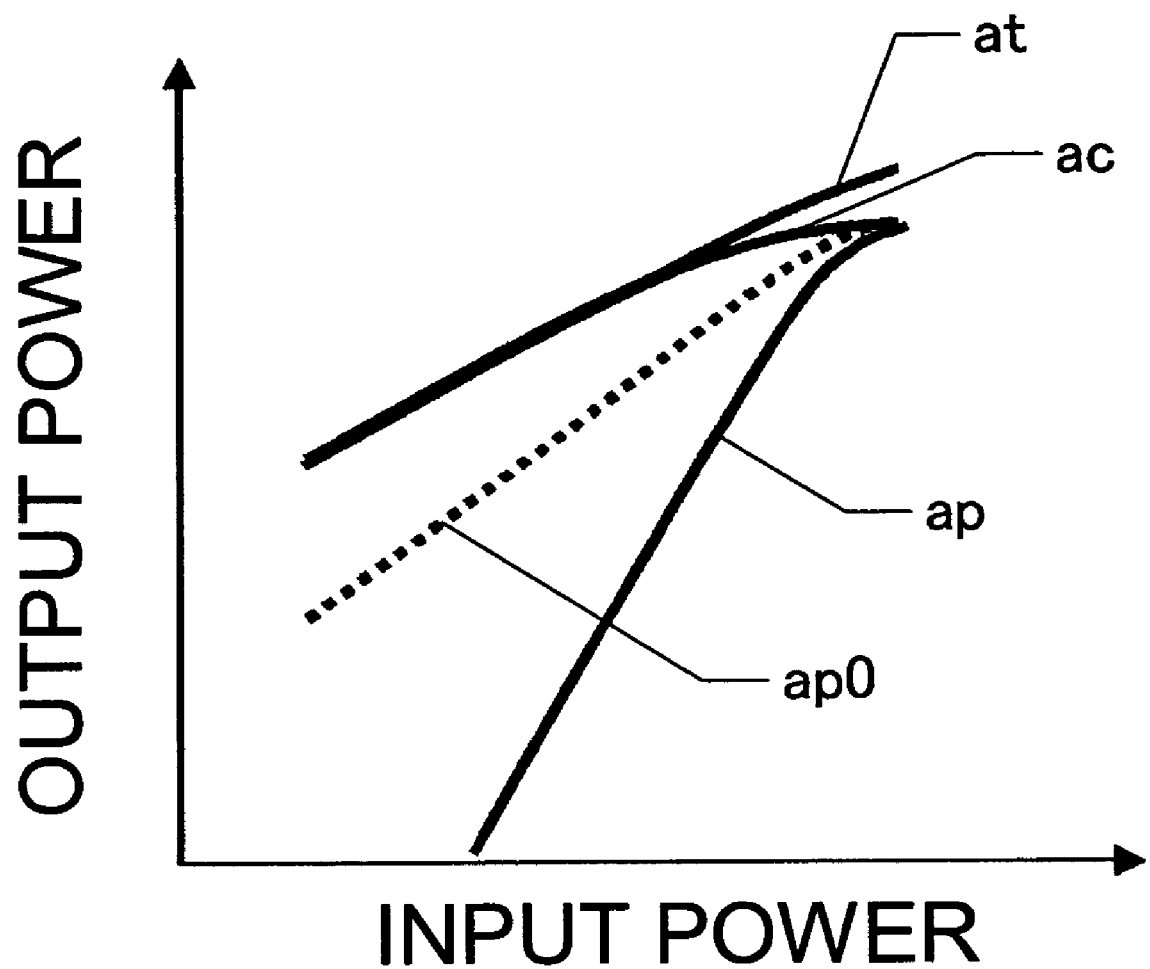
FIG. 9 is a graph showing the input/output characteristics of the carrier amplifier and peak amplifier of a Doherty amplifier and the input/output characteristics of the Doherty amplifier including the carrier amplifier and peak amplifier.

In the input/output characteristics of the Doherty amplifier shown in FIG. 9, the solid line ap indicates the input/output characteristics of the peak amplifier including the HEMT of the first embodiment, and the broken line ap0 indicates the input/output characteristics of the peak amplifier including the comparative example HEMT. Particularly in the small input power region, an output power of the peak amplifier including the HEMT of the first embodiment is smaller than that of the peak amplifier including the comparative example HEMT. This is because a gain at a small input power can be suppressed, as described with reference to FIG. 6A.

By using the HEMT of the first embodiment, an output of the peak amplifier at a small input power can be suppressed. Namely, an increase in the d.c. component of an output power can be suppressed. It is therefore possible to improve an efficiency of the Doherty amplifier itself.

If the amplifier is adopted at a base station, a distortion compensating circuit is generally combined with the amplifier to reduce leakage power to adjacent channels. As the distortion compensating circuit, for example, a digital pre-distortion (DPD) has been adopted, in which distortion is compensated by applying in advance a signal having inverse characteristics of distortion to be generated. The carrier amplifier frequently operates in the saturation region. Therefore, since a large positive voltage is applied to the gate electrode, gate leak current is likely to increase. An increase in the gate leak current may cause collapse of distortion compensation. If an output power exceeds some level, distortion compensation is collapsed.

A Doherty amplifier using the conventional HEMT for each of the carrier amplifier and peak amplifier had an efficiency of 35% at a distortion compensation collapsed point, whereas a Doherty amplifier using the HEMT of the first embodiment for the peak amplifier had an efficiency of 42% at a distortion compensation collapsed point. An efficiency of a Doherty amplifier can thus be improved by using the HEMT of the first embodiment as the peak amplifier of the Doherty amplifier.

In the first embodiment described above, it is preferable to set an atomic ratio Al/(group III element) at the bottom of the lower electron supply layer 4 to a range between 0.03 and 0.07. As the atomic ratio Al/(group III element) is made small, a density of two-dimensional electron gas in the lower channel CH1 becomes low, whereas as the atomic ratio Al/(group III element) is made large, the density of two-dimensional electron gas becomes high. If the density of two-dimensional gas in the lower channel CH1 becomes too low, the lower channel CH1 is not generated substantially. As the two-dimensional electron gas density of the lower channel CH1 becomes high, the saturation drain current induced by the lower channel CH1 shown in FIG. 5 becomes large, and a flat region in the skirt region of the curve cp becomes long. In this case, the efficiency lowers because a pinch-off current is likely to flow in the high drain voltage region during gate-off.

An atomic ratio Al/(group III element) at the upper surface of the lower electron supply layer 4 is preferable set to a range between 0 and 0.03. As the atomic ratio Al/(group III element) becomes large, lattice mismatch becomes large at the interface between the upper electron transport layer 5 and lower electron supply layer 4, and piezo charges are accumulated so that a level at the lower end of the conduction band of the energy band diagram is raised.

A concentration of n-type dopant of the lower electron supply layer 4 is preferably set to a range between $1 \times 10^{17}$ cm$^{-3}$ and $5 \times 10^{18}$ cm$^{-3}$, and more preferable to a range between $5 \times 10^{17}$ cm$^{-3}$ and $2 \times 10^{18}$ cm$^{-3}$. If a concentration of n-type dopant is too low, an electron density lowers so that sufficient electrons cannot be supplied to the lower channel CH1. Conversely, if the concentration of n-type dopant is made high, a density of free electrons in the lower electron supply layer 4 becomes high. Free electrons in the lower electron supply layer 4 have a mobility lower than that of electrons accumulated in the lower channel CH1, and negatively affect the operation of the HEMT. Further, electrical isolation between the source and drain electrodes becomes insufficient.

A concentration of n-type dopant of the upper electron transport layer 5 is preferably set to a range between 0 and $5 \times 10^{17}$ cm$^{-3}$, and more preferably to a range between 0 and $1 \times 10^{16}$ cm$^{-3}$. If the concentration of n-type dopant is high, a mobility of electrons accumulated in the upper channel CH0 lowers.

A thickness of the lower electron supply layer 4 is preferably set to a range between 2 nm and 50 nm, and more preferably to a range between 5 nm and 10 nm. A thickness of the upper electron supply layer 5 is preferably set to a range between 5 nm and 100 nm, and more preferably to a range between 10 nm and 50 nm. As the upper electron transport layer 5 is thinned, a mobility of electrons accumulated in the upper channel CH0 lowers. As the lower electron supply layer 4 is thickened, electrical isolation between the source and drain electrodes becomes insufficient.

As a total thickness of the lower electron supply layer 4 and upper electron transport layer 5 becomes thick, a distance between the lower channel CH1 and upper channel CH0 becomes long. As the distance becomes long, a difference of gate-source capacitance becomes large between a state that only the lower channel CH1 is generated and a state that both the lower and upper channels CH0 and CH1 are generated. As a change amount of capacitance becomes large, there is a large difference of phase characteristics between the carrier amplifier and peak amplifier.

In the first embodiment described above, although the lower electron transport layer 3 is made of non-doped GaN, n-type dopant may be added to a region of the lower electron transport layer 3 being in contact with the lower electron supply layer 4. As n-type dopant is added, a mobility of two-dimensional electron gas accumulated in the lower channel CH1 lowers. It is therefore possible to make gentler a slope of the skirt region of the gate voltage-drain current characteristics cp shown in FIG. 5.

The first embodiment adopts the configuration that the gain of the peak amplifier is suppressed at a small input power. As the input power becomes large, the HEMT of the carrier amplifier more frequently operates in the saturation region, and gate leak current increases. Next, the second embodiment will be described which can suppress an increase in the gate leak current of the HEMT of the carrier amplifier.

Figure 7:
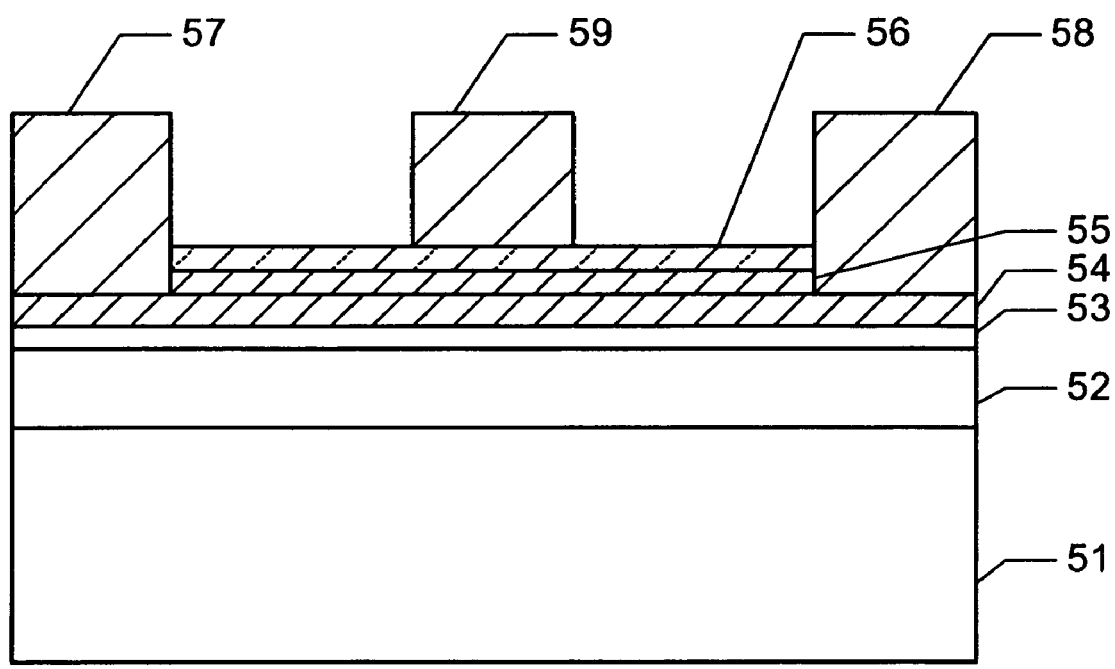
FIG. 7 is a cross sectional view of a HEMT according to a second embodiment.

FIG. 7 is a cross sectional view of the HEMT according to the second embodiment. Formed on a substrate 51 of SiC are an electron transport layer 52 made of non-doped GaN, a non-doped layer 53 made of non-doped $Al_{0.25}Ga_{0.75}N$ and an electron supply layer 54 made of n-type $Al_{0.25}Ga_{0.75}N$. A source electrode 57 and a drain electrode 58 are disposed on the electron supply layer 54 at a distance from each other.

A protective layer 55 of n-type GaN covers the surface of the electron supply layer 54 between the source electrode 57 and drain electrode 58. An insulating layer 56 of SiN is disposed on the protective layer 55. A gate electrode 59 is disposed in a partial surface area of the insulating layer 56. The gate electrode 59 is disposed at a distance from both the source electrode 57 and drain electrode 58. A thickness of the insulating layer 56 is set to 20 nm. The HEMT of the second embodiment has therefore not a Schottky gate structure but an insulated gate structure.

Figure 8:
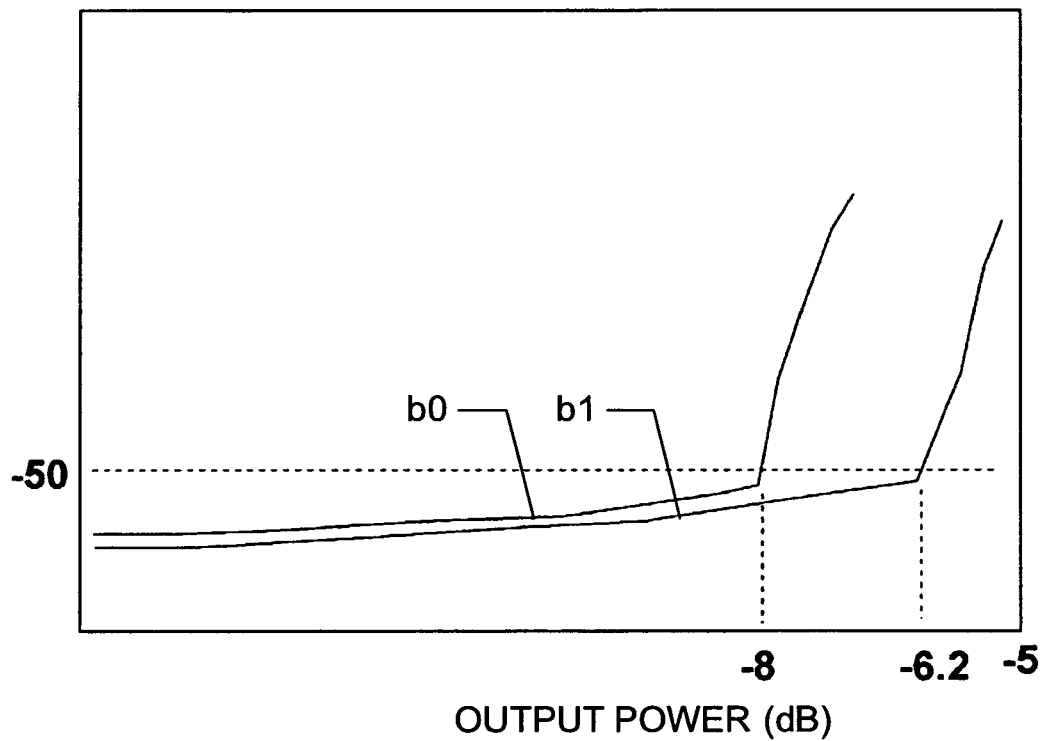
FIG. 8 is a graph showing a relation between leakage power to adjacent channels and an output power of the HEMT of the second embodiment and a HEMT having a Schottky gate structure.

FIG. 8 shows the relation between an output power of a Doherty amplifier and a leakage power to an adjacent channel. The abscissa represents an output power represented by a back-off amount from a saturation output in the unit of "dB", and the ordinate represents a leakage power to an adjacent channel in the unit of "dBc". A solid line b1 in FIG. 8 indicates the relation when the HEMT of the second embodiment is used in the carrier amplifier, and a solid line b0 indicates the relation when the HEMT of the Schottky gate structure without the insulating film 56 shown in FIG. 7 is used in the carrier amplifier.

When the HEMT of the Schottky gate structure is used, a leakage power increases abruptly at an output power of −8 dB. This means that distortion compensation is collapsed. When the HEMT of the second embodiment having the insulated gate structure is used, distortion compensation is not collapsed up to −6.2 dB. This is because an increase in forward gate leak current can be suppressed even while the carrier amplifier operates in the saturated region.

As described above, by using the HEMT of the insulated gate structure as the carrier amplifier, it becomes possible to increase an output power at the distortion compensation collapsed point and realize a high efficiency.

A gate length of the HEMT used for the carrier amplifier and peak amplifier is preferably set to a range between 0.3 μm and 0.7 μm, and more preferably to a range between 0.5 μm and 0.6 μm. As the gate length is elongated, the gain of the Doherty amplifier lowers and distortion characteristics are deteriorated. If the gate length is shorter than 0.5 μm, a breakdown voltage lowers to 200 V or lower. An efficiency lowers because of deterioration of pinch-off characteristics, and reliability of the device lowers.

A unit gate width is preferably set to a range between 200 μm and 350 μm, and more preferably to a range between 250 μm and 300 μm. As the unit gate width is widened, the gain of the Doherty amplifier lowers, whereas as the unit gate width is narrowed, a maximum power to be output lowers.

In the embodiments described above, although SiC is used as the material of the substrate 1, substrates of other materials such as GaN, sapphire and Si may also be used. The upper electron supply layer 7 may be made of AlGaInN instead of AlGaN. A threshold voltage of the HEMT can be changed by controlling an atomic ratio In/(group III element) to adjust a band gap of the upper electron supply layer 4. Each of the electron transport layer, electron supply layer and the like may be made of other compound semiconductor material.

The present invention has been described in connection with the preferred embodiments. The invention is not limited only to the above embodiments. It will be apparent to those skilled in the art that other various modifications, improvements, combinations, and the like can be made.

What is claimed is:

1. A Doherty amplifier having a carrier amplifier and a peak amplifier, wherein the peak amplifier comprises a first field effect transistor and the first field effect transistor comprises:

a lower electron transport layer made of compound semiconductor material;

a lower electron supply layer disposed over the lower electron transport layer and made of compound semiconductor material doped to n-type and having an electron affinity smaller than an electron affinity of the lower electron transport layer;

an upper electron transport layer disposed over the lower electron supply layer and made of compound semiconductor material having a doping concentration lower than a doping concentration of the lower electron supply layer or non-doped compound semiconductor material;

an upper electron supply layer disposed over the upper electron transport layer and made of n-type compound semiconductor material having an electron affinity smaller than an electron affinity of the upper electron transport layer;

a source electrode and a drain electrode disposed over the upper electron supply layer at a distance from each other and being in ohmic contact with the lower electron transport layer and the upper electron transport layer; and a gate electrode disposed over the upper electron supply layer between the source electrode and the drain electrode.

2. The Doherty amplifier according to claim 1, further comprises a bias circuit for applying a d.c. gate bias voltage to a gate electrode of the first field effect transistor so as not to generate a channel at an interface between the upper electron transport layer and the upper electron supply layer, but to generate a channel at an interface between the lower electron transport layer and the lower electron supply layer.

3. The Doherty amplifier according to claim 1, wherein the carrier amplifier includes a second field effect transistor and the second field effect transistor comprises:

an electron transport layer made of compound semiconductor material;

an electron supply layer disposed over the electron transport layer and made of compound semiconductor material having an electron affinity smaller than an electron affinity of the electron transport layer;

a source electrode and a drain electrode being in ohmic contact with the electron transport layer;

a gate electrode disposed over the electron supply layer between the source electrode and the drain electrode; and a gate insulating film made of insulating material and disposed between the gate electrode and the electron supply layer.

* * * * *